United States Patent
Sridharamurthy et al.

(10) Patent No.: US 10,322,926 B1
(45) Date of Patent: Jun. 18, 2019

(54) MEMS DEVICE WITH REDUCED DYNAMIC STRESS AND METHODS

(71) Applicant: mCube, Inc., San Jose, CA (US)

(72) Inventors: Sudheer Sridharamurthy, San Jose, CA (US); Te-Hsi Terrence Lee, San Jose, CA (US); Wenhua Zhang, San Jose, CA (US)

(73) Assignee: mCube, Inc., San Jose, CA (US)

( * ) Notice: Subject to any disclaimer, the term of this patent is extended or adjusted under 35 U.S.C. 154(b) by 641 days.

(21) Appl. No.: 14/887,737

(22) Filed: Oct. 20, 2015

(51) Int. Cl.
*G01C 19/56* (2012.01)
*B81B 3/00* (2006.01)
*B81C 1/00* (2006.01)

(52) U.S. Cl.
CPC ........ *B81B 3/0072* (2013.01); *B81C 1/00666* (2013.01); *B81B 2201/0235* (2013.01); *B81B 2201/0242* (2013.01); *B81B 2203/0163* (2013.01); *B81B 2203/0307* (2013.01); *B81B 2203/0361* (2013.01)

(58) Field of Classification Search
CPC .......... B81B 3/0072; B81B 2201/0235; B81B 2201/0242; B81B 2203/0163; B81B 2203/0307; B81B 2203/0361; B81C 1/00666; G01C 19/5719; G01C 19/42; G01P 7/00; G01P 15/14; A63B 2220/40
See application file for complete search history.

(56) References Cited

U.S. PATENT DOCUMENTS

| 8,516,891 B2* | 8/2013 | Zhang ................... B81B 3/0051 73/514.32 |
| 8,932,893 B2* | 1/2015 | Lagouge ............. B81C 1/00801 257/415 |
| 2012/0038963 A1* | 2/2012 | Takubo ................... B81B 3/001 359/224.1 |
| 2015/0183636 A1* | 7/2015 | Akiba ................... B81B 3/0051 257/417 |
| 2015/0241216 A1* | 8/2015 | Ahtee ................ G01C 19/5712 73/504.12 |

* cited by examiner

*Primary Examiner* — Lisa M Caputo
*Assistant Examiner* — Nigel H Plumb
(74) *Attorney, Agent, or Firm* — Richard T. Ogawa; Ogawa P.C.

(57) ABSTRACT

A structure for a MEMS device includes a MEMS layer comprising a mass portion and a spring portion, a substrate coupled to the MEMS layer, wherein the substrate comprises a planar region and an stopper region, wherein the MEMS device and the substrate are oriented in a plurality of relative orientations in response to an external force, wherein the spring portion and the stopper region are configured to disengagingly impact when the external force exceeds a first threshold force, wherein the mass portion and the planar region are configured to disengagingly impact when the external force exceeds a second threshold force, and wherein the second threshold force exceeds the first threshold force.

20 Claims, 6 Drawing Sheets

MEMS DEVICE WITH REDUCED DYNAMIC STRESS AND METHODS

BACKGROUND OF THE INVENTION

The present invention is directed to MEMS (Micro-Electro-Mechanical-Systems). More specifically, embodiments of the invention provide methods and structures for a MEMS device having reduced dynamic stress.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Blackberry Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving IC devices and MEMS are highly desired.

BRIEF SUMMARY OF THE INVENTION

The present invention is directed to integrated MEMS (Micro-Electro-Mechanical-Systems) IC (Integrated Circuit) devices. More specifically, embodiments of the invention provide a method and structure of a MEMS device with reduced dynamic stress.

Embodiments of the present invention provide a MEMS device that includes structures that reduce dynamic stress effects between a proof mass portion of a MEMS device and a substrate resulting in out-of plane movement. In various embodiments, in cases where a MEMS device is subject to high dynamic stresses, e.g. a phone including a gyroscope falling to a floor, a proof mass portion of the MEMS device and an underlying substrate may impact. The impact may have a number of harmful side consequences on the operation MEMS device. For example, the proof mass and the substrate adhere to one another as a result of stiction forces, or the like; contaminants may form within the MEMS device cavity and interfere with the subsequent operation of the MEMS device; and the like.

In various embodiments, to reduce the harmful out-of plane impacts between the proof mass portion of a MEMS device and other portions of the MEMS device, and/or the substrate. In some instances, the MEMS device may include one or more spring-like structures that reduce magnitudes of impacts between a proof mass portion of the MEMS device and other portions of the MEMS device or a substrate. In some instances, the other portions of the MEMS device or the substrate may also have a structured region where the proof mass portion impacts. For example, the structured region may include one or more stopper regions, spring-like regions, or the like.

The stopper regions may be disposed upon an underlying metal layer. In some cases, the stopper regions may also be physically coupled to an underlying insulating layer. Such embodiments help reduce undesirable aspects of impact between the MEMS device and the substrate. In other embodiments, the substrate may also, or alternatively include one or more spring-like structures for reducing the dynamic impact.

In some embodiments of the present invention, a MEMS device includes structures that reduce dynamic stress effects between a proof mass portion of a MEMS device and other portions of the MEMS device. In various embodiments, in cases where a MEMS device is subject to high dynamic stresses, e.g. a watch including an accelerometer falling to a floor, a proof mass portion of the MEMS device and a surrounding portion of the MEMS device may impact. In various embodiments, the surrounding portions of the MEMS device may be physically coupled to an underlying substrate. The impact may have a number of harmful side effects on the operation MEMS device. For example, the proof mass and other portions of the MEMS device may become deformed; particles may be formed as a result of the impact; and the like. In various embodiments, structures may be fabricated as part of a MEMS proof mass and/or the other portions of the MEMS device and may include one or more spring-like structures that reduce magnitudes of these impacts. In some embodiments of the present invention, the spring-like structures may include leaf-type springs, torsion-type springs, or the like.

Various additional objects, features, and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention relates to MEMS devices. More specifically, the present invention relates to increasing durability of MEMS devices. Typical MEMS devices includes accelerometers, gyroscopes, pressure sensors, and the like.

Figure 1:
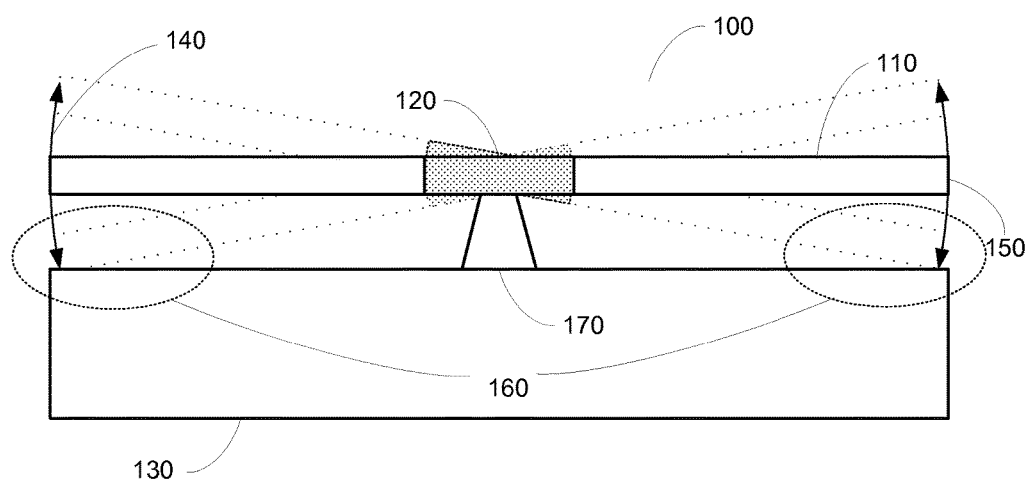
FIG. 1 illustrates configurations of embodiments of MEMS devices.

FIG. 1 illustrates configurations of embodiments of MEMS devices. More specifically, FIG. 1 illustrates a typical MEMS device 100 including a proof mass 110 and a restoring spring 120 and a substrate 130. In typical operation, proof mass 110 and substrate 130 move towards and away from each other within a typical range 140 as a result of external physical movement or shock. Restoring spring 120 is used to urge proof mass 110 back to an equilibrium position 150.

In various embodiments, if an external show is sufficient large, proof mass 110 may collide with and stick to substrate 130. In such cases, the restoring spring 120 is unable to restore proof mass 110 to equilibrium position 150 due to stiction forces between proof mass 110 and substrate 130. How long proof mass 110 is stuck to substrate 130 is unpredictable. Further, while stuck, MEMS device 110 will return incorrect readings, e.g. incorrect acceleration, pressure, or the like.

Figure 2A:
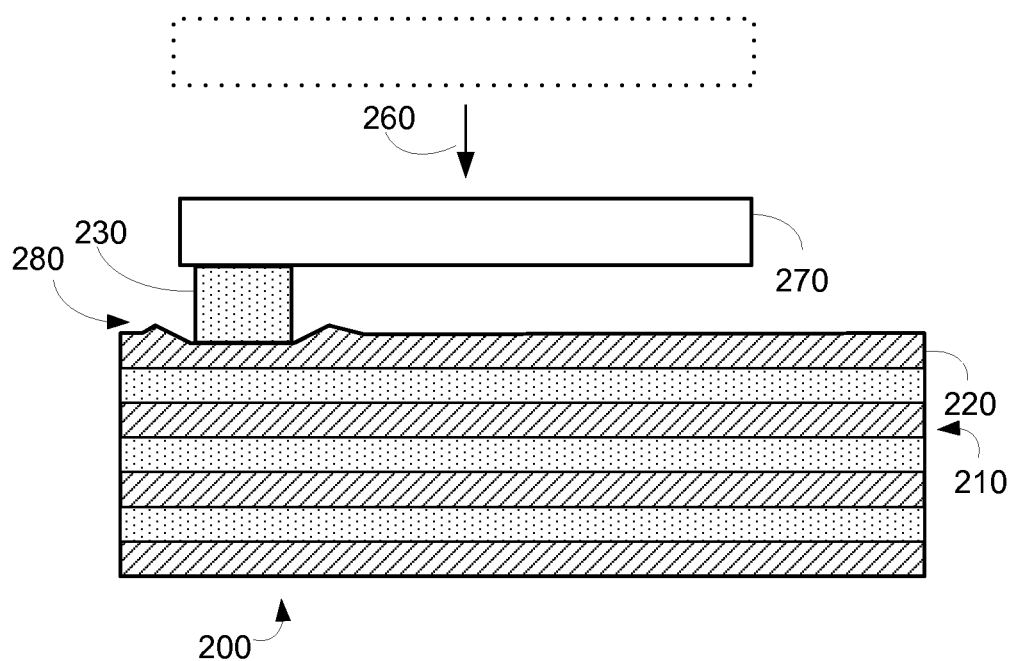
FIGS. 2A-B illustrate various configurations of embodiments of stoppers upon a substrate.
Figure 2B:
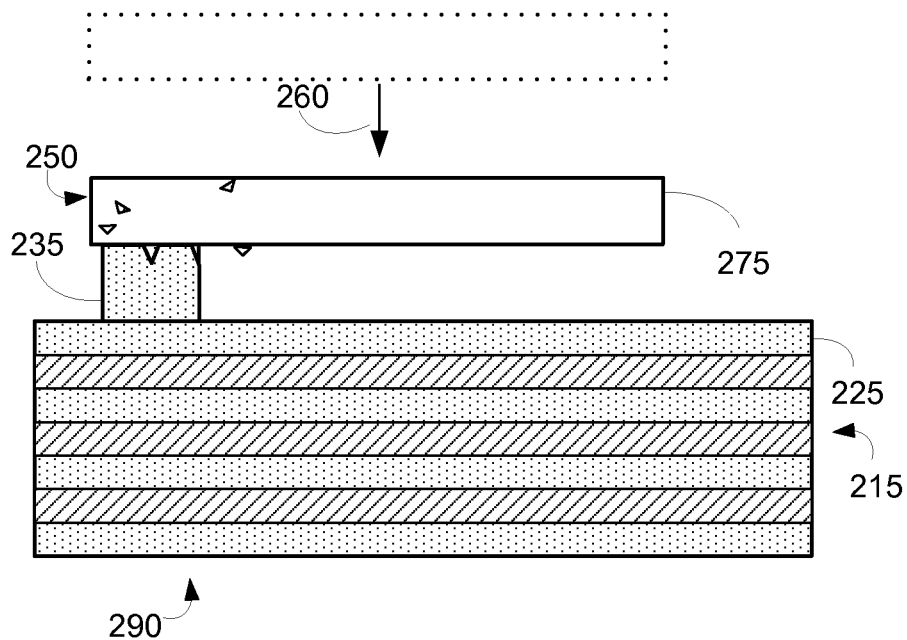

FIGS. 2A-B illustrate various configurations of embodiments of stoppers upon a substrate. In various embodiments, stoppers are typically configured as an oxide structure upon a substrate. The oxide structures are typically used to reduce the stiction forces, describe above. In FIG. 2A, a substrate 200 is illustrated having a number of device layers 210, including a top metal layer 220, and an oxide bump 230. In operation, it was discovered by the inventors of the present invention that when a proof mass portion 270 of a MEMS device moves 260 and strikes oxide bump 230, oxide bump 230 sinks into substrate 200. More specifically, oxide bump 230 tends to deform 280 top metal layer 220 when oxide bump 230 is impacted by the MEMS device. In some situations, the deformation of top metal layer 220 renders the circuitry embodied within device layers 210 inoperable.

In FIG. 2B a substrate 290 is illustrated having a number of device layers 215, including a top insulating/dielectric layer 225, and an oxide bump 235. In operation, it was discovered by the inventors of the present invention that when a proof mass portion 275 of a MEMS device moves 265 and strikes oxide bump 235, oxide bump 235 tends to chip and produce particles 250. In some situations, the particles interfere with the movement of proof mass portion 275 within a MEMS cavity, rendering the output data unreliable.

FIGS. 3A-D illustrate embodiments of the present invention. More specifically, FIGS. 3A-D illustrate embodiments that use of interfacial springs between MEMS proof masses and stoppers to reduce the problems described in FIGS. 2A-B.

Figure 3A:
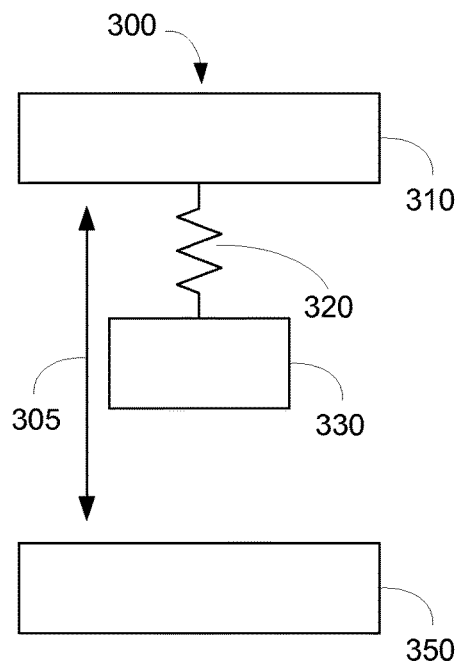
FIGS. 3A-D illustrate embodiments of the present invention.
Figure 3B:
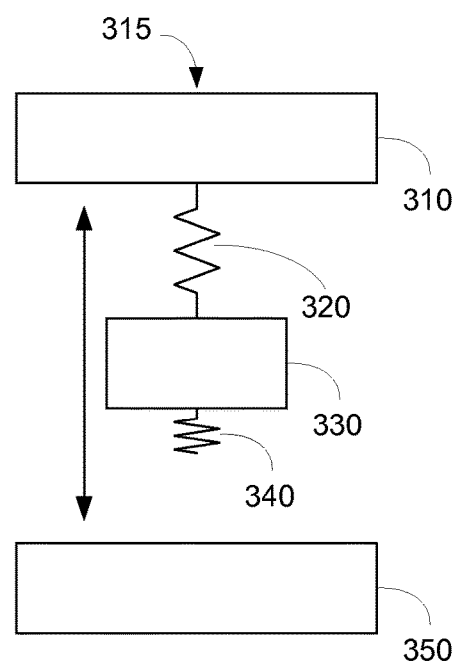
Figure 3C:
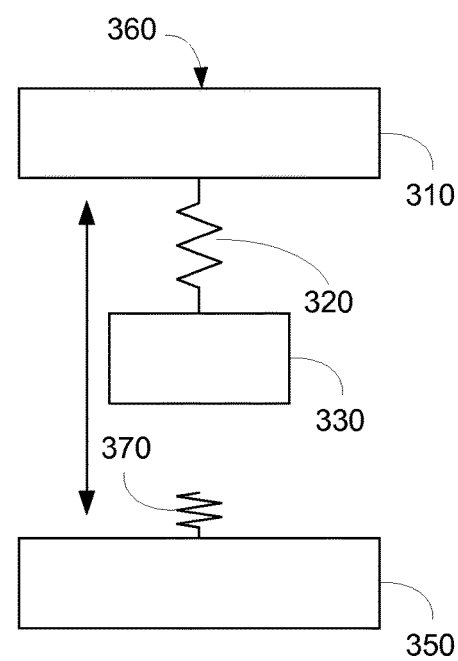
Figure 3D:
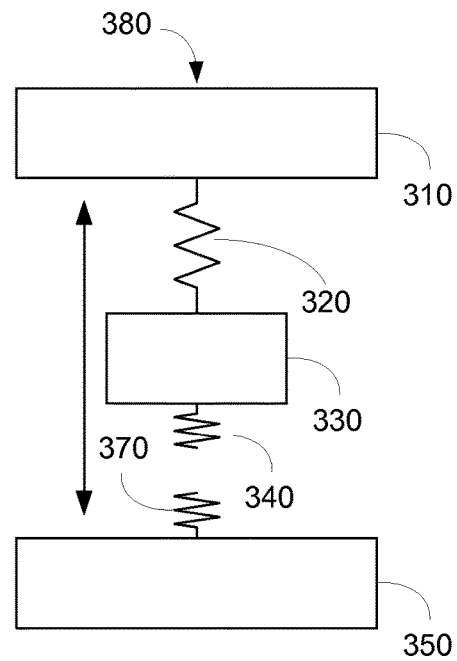

In FIG. 3A, a MEMS device 300 is illustrated in including a substrate anchor portion 310, a restoring spring portion 320, a proof mass portion 330, an interfacial spring 340, and a stopper 350. As illustrated, interfacial spring 340 is coupled to proof mass portion 330. In some embodiments, substrate anchor portion 310 and stopper 350 are coupled to a common substrate. In FIG. 3B, a MEMS device 360 is illustrated wherein the interfacial spring 370 is coupled to a stopper 350. Further, in FIG. 3C, a MEMS device 380 is illustrated wherein interfacial spring 340 is coupled to proof mass portion 330 and interfacial springs 370 is coupled to a stopper 350. In other embodiments, more than one interfacial springs may be coupled to the proof mass and/or the stopper for additional benefits.

In operation, upon receiving an external physical shock or perturbation, the interfacial spring(s) and stoppers impact before the proof mass and substrate impact, if at all. More specifically, as the interfacial springs compress, they reduce the energy of impact between the proof mass. This reduces the chance that particles will be introduced within the MEMS cavity. Further, when compressed, the interfacial springs help separate the proof mass and the substrate. This reduces the chance that stiction forces will keep the proof mass against the substrate.

Figures 4A, 4B, 4C:
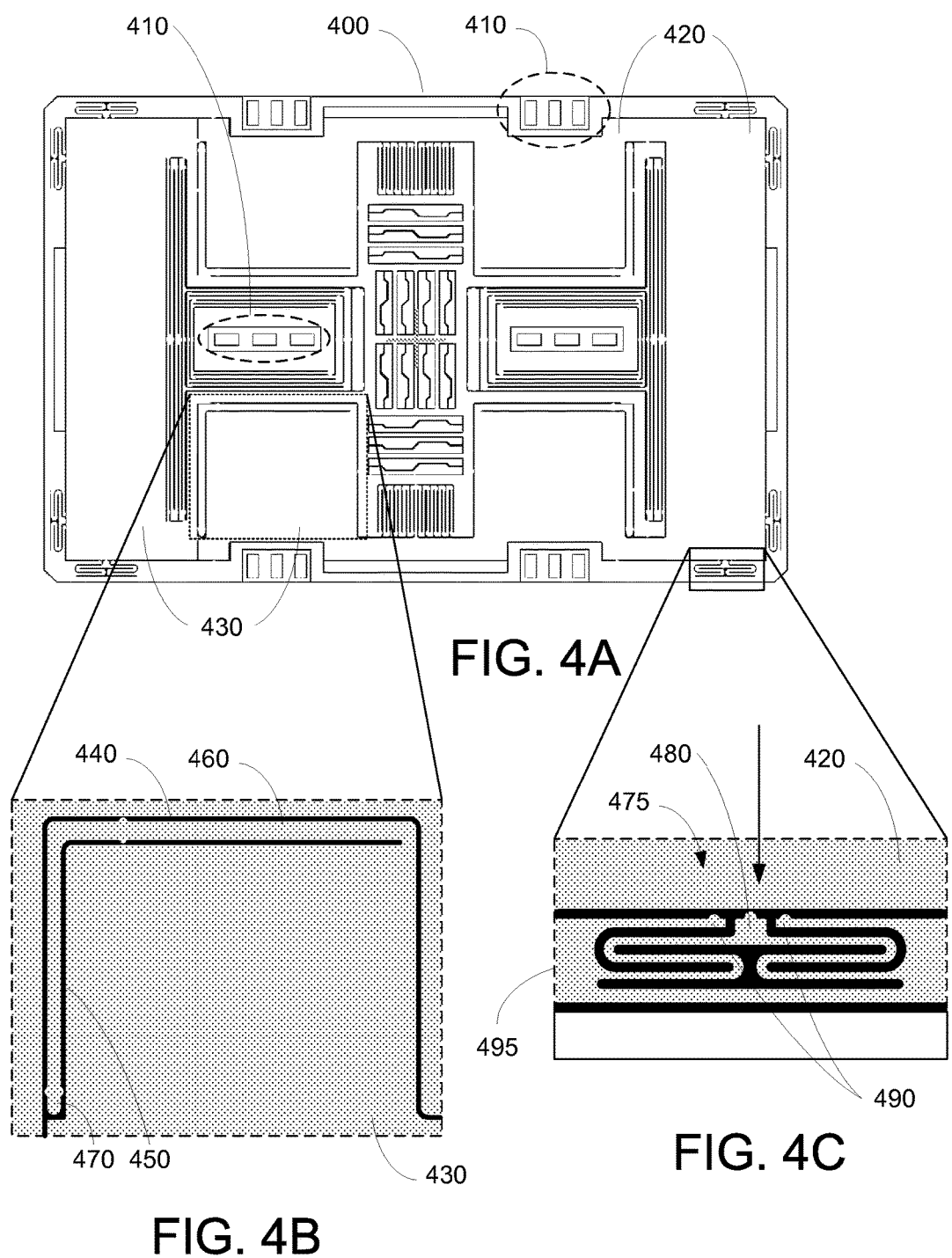
FIGS. 4A-C illustrate an embodiment of the present invention.

FIGS. 4A-C illustrate an embodiment of the present invention. More specifically, FIG. 4A is a top view of a metal layer 400 of a MEMS device. In this embodiment, metal layer 400 is anchored at one or more anchor portions 410 to an underlying substrate (an anchor region of the substrate), and proof mass portions 420 and 430 move towards and away from the substrate (e.g. in and out of the page).

Illustrated in FIG. 4B is a close-up of a first spring structure 440. In this example, first spring structure 440 includes two spring-like structures, a leaf spring 450 and a torsion spring 460. As can be seen, first spring structure 440 is coupled to the metal layer 400 and to proof mass portions 420 and 430. In various embodiments, the tip 470 of leaf spring 450 is adapted to impact a stopper structure, discussed above, that is disposed upon the underlying substrate.

In operation, first spring structure 440 is adapted to reduce out-of-plane impacts of the MEMS device. Accordingly, when proof mass portion 430 moves towards the substrate, tip 470 of leaf spring 450 first makes contact with underlying the stopper structure. Next, leaf spring 450 bends (upwards, out of the page) and torsion spring 460 twists, thereby reducing the speed of proof mass portion 430 as it impacts the underlying substrate. Additionally, after impact, the stored energy in the bent leaf spring 450 and the twisted torsion spring 460 helps separate proof mass portion 430 and the underlying substrate.

In alternative embodiments, other types and number of spring-like structures may be formed upon the metal layer. For example, different geometric configurations for leaf springs and torsion springs may provide different spring force profiles; multiple leaf springs, each having different lengths may be used to provide increased amount of spring force; and the like. In light of the present disclosure, it is expected that one of ordinary skill in the art may envision additional spring configurations that are within the scope of the present invention.

Illustrated in FIG. 4C is a close-up of a second spring structure 475. In this example, second spring structure 475 includes two spring-like structures, a first spring 480 and a second springs 490. As can be seen, second spring structure 475 is coupled to a frame 495 of the metal layer 400. In various embodiments, first spring 480 and second springs 490 are adapted to impact the edge of proof mass 420.

In operation, second spring structure 475 is adapted to reduce in-plane impacts of the MEMS device (e.g. proof mass versus frame). Accordingly, when proof mass portion 420 moves towards frame 495 in the direction shown, first spring 480 first makes contact with mass portion 420 and first spring 480 deforms. This reduces the relative speed of mass portion 420 to frame 495. Subsequently, if proff mass portion 420 continues to move towards frame 495, second springs 490 then make contact with mass portion 420 and second springs 490 deform. This further reduces the relative speed of mass portion 420 to frame 495 further. In various embodiments, if mass portion 420 still impacts frame 495, it is expected that the impact will not be harmful to either portion.

In alternative embodiments, other types and number of spring-like structures may be formed upon the metal layer. For example, different geometric configurations for first spring 480 and/or second springs 490 may be used to provide different spring force profiles. In light of the present disclosure, it is expected that one of ordinary skill in the art may envision additional spring configurations that are within the scope of the present invention.

Figure 5:
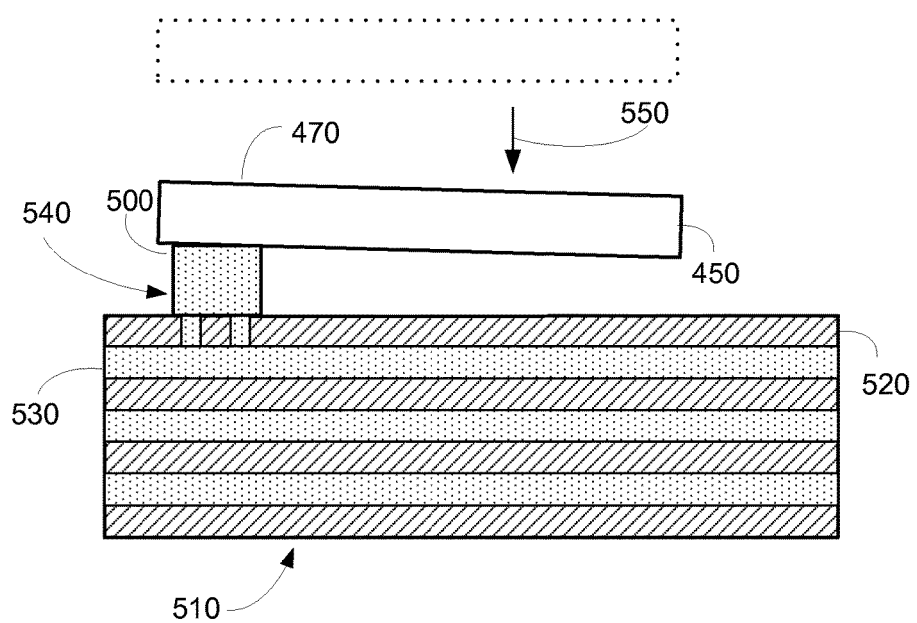
FIG. 5 illustrates another embodiment of the present invention.

FIG. 5 illustrates another embodiment of the present invention. More specifically, FIG. 5 illustrates a cross-section of an embodiment of a stopper structure 500, upon a substrate 510. In this embodiment, an oxide stopper structure 500 is formed above a metal layer 520, as illustrated above. However, in this embodiment, to avoid stopper structure 500 from deforming metal layer 520, the stopper structure 500 in anchored to an underlying oxide 530 (e.g. insulating, dielectric material) layer through one or more pillar structures 540.

In operation, for out-of plane motion, tip 470 of leaf spring 450 initially moves 550 and contacts stopper structure 500. As leaf spring 450 pushes against stopper structure 500, the force is transferred to the underlying oxide 530, and the metal layer 520 is not adversely affected. If the force is large enough proof mass portion 430 impacts metal layer 520, however particles are not readily produced due to the softness of the respective metal layers.

Figure 6:
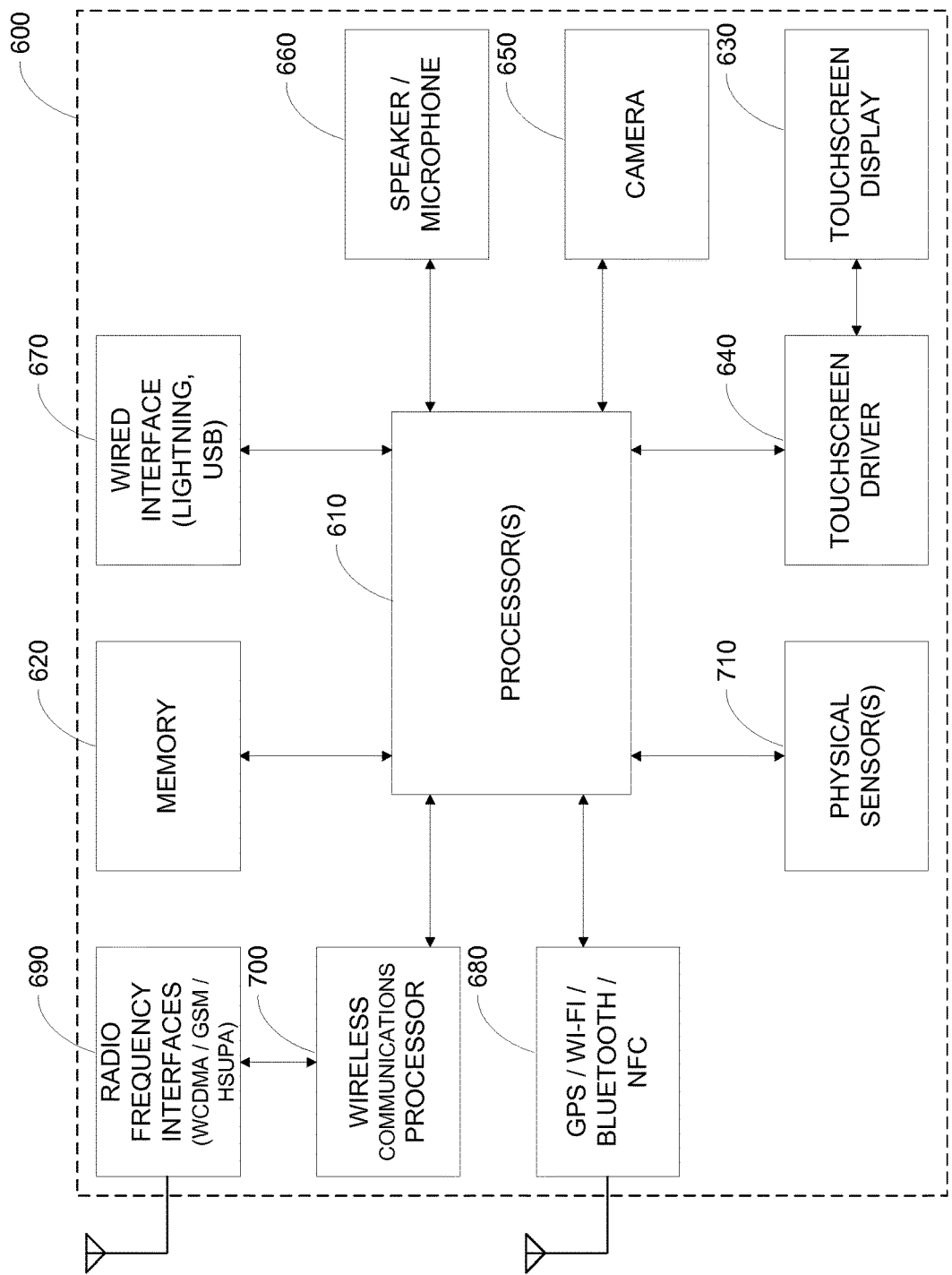
FIG. 6 illustrates a functional block diagram of various embodiments of the present invention.

FIG. 6 illustrates a functional block diagram of various embodiments of the present invention. In FIG. 6, a computing device 600 typically includes some or all of the following: an applications processor 610, memory 620, a touch screen display 630 and driver 640, an image acquisition device 650, audio input/output devices 660, a power supply (e.g. battery) and the like. Additional communications from and to computing device may be provided by via a wired interface 670, a GPS/Wi-Fi/Bluetooth interface 680, RF interfaces 690 and driver 700, and the like. Also included in various embodiments are physical sensors 710.

In various embodiments, computing device 600 may be a hand-held computing device (e.g. Android tablet, Apple iPad), a smart phone (e.g. Apple iPhone, Google Nexus, Samsung Galaxy S), a portable computer (e.g. netbook, laptop, ultrabook), a media player, a reading device (e.g. Amazon Kindle, Barnes and Noble Nook), a wearable device (e.g. Apple Watch, Android watch, FitBit device, or other wearable device), or the like.

Typically, computing device 600 may include one or more processors 610. Such processors 610 may also be termed application processors, and may include a processor core, a video/graphics core, and other cores. Processors 610 may be a processor from Apple (e.g. A9), Qualcomm (Snapdragon), or the like. In other embodiments, the processor core may be an Intel processor, an ARM Holdings processor such as the Cortex or ARM series processors, or the like. Further, in various embodiments, the video/graphics core may be an ARM processor, Imagination Technologies processor PowerVR graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 620 may include different types of memory (including memory controllers), such as flash memory (e.g. NOR, NAND), pseudo SRAM, DDR SDRAM, or the like. Memory 620 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, a touch screen display 630 and driver 640 may be provided and based upon a variety of later-developed or current touch screen technology including: resistive displays, capacitive displays, optical sensor displays, or the like. Additionally, touch screen display 630 may include single touch or multiple-touch sensing capability. Any later-developed or conventional output display technology may be used for the output display, such as TFT-LCD, OLED, Plasma, electronic ink (e.g. electrophoretic, electrowetting, interferometric modulating), or the like. In various embodiments, the resolution of such displays and the resolution of such touch sensors may be set based upon engineering or non-engineering factors (e.g. sales, marketing). In some embodiments of the present invention, a display output port, such as an HDMI-based port, DVI-based port, or the like may also be included.

In some embodiments of the present invention, image capture device 650 may be provided and include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, proximity detection, or the like.

In various embodiments, audio input/output 660 may be provided and include microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 610 to enable the user to operate computing device 600 by stating voice commands. Additionally, a speech engine may be provided in various embodiments to enable computing device 600 to provide audio status messages, audio response messages, or the like.

In various embodiments, wired interface 670 may be used to provide data transfers between computing device 600 and an external source, such as a computer, a remote server, a storage network, another computing device 600, or the like.

Such data may include application data, operating system data, firmware, or the like. Embodiments may include any later-developed or conventional physical interface/protocol, such as: USB, micro USB, mini USB, Firewire, Apple Lightning connector, Ethernet, POTS, or the like. Additionally, software that enables communications over such networks is typically provided.

In various embodiments, a wireless interface 680 may also be provided to provide wireless data transfers between computing device 600 and external sources, such as computers, storage networks, headphones, microphones, cameras, or the like. As illustrated in FIG. 8, wireless protocols may include Wi-Fi (e.g. IEEE 802.11a/b/g/n, WiMax), Bluetooth, IR, near field communication (NFC), ZigBee, ZWave, and the like.

GPS receiving capability may also be included in various embodiments of the present invention, however is not required. As illustrated in FIG. 8, GPS functionality is included as part of wireless interface 680 merely for sake of convenience, although in implementation, such functionality is currently performed by circuitry that is distinct from the Wi-Fi circuitry and distinct from the Bluetooth circuitry.

Additional wireless communications may be provided via RF interfaces 690 and drivers 700 in various embodiments. In various embodiments, RF interfaces 690 may support any future-developed or conventional radio frequency communications protocol, such as CDMA-based protocols (e.g. WCDMA), GSM-based protocols, HSUPA-based protocols, or the like. In the embodiments illustrated, driver 700 is illustrated as being distinct from applications processor 610. However, in some embodiments, these functionality are provided upon a single IC package, for example the Marvel PXA330 processor, and the like. It is contemplated that some embodiments of computing device 600 need not include the RF functionality provided by RF interface 690 and driver 700.

FIG. 8 also illustrates computing device 600 to include physical sensors 710. In various embodiments of the present invention, physical sensors 710 are multi-axis Micro-Electro-Mechanical Systems (MEMS) based devices being developed by m-Cube, the assignee of the present patent application. Such sensors typically include very low power three-axis sensors (linear, gyro or magnetic); ultra-low jitter three-axis sensors (linear, gyro or magnetic); low cost six-axis motion sensor (combination of linear, gyro, and/or magnetic); ten-axis sensors (linear, gyro, magnetic, pressure); and various combinations thereof.

FIG. 8 is representative of one computing device 600 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 8. For example, in various embodiments, computing device 600 may lack image acquisition unit 650, or RF interface 690 and/or driver 700, or GPS capability, or the like. Additional functions may also be added to various embodiments of computing device 600, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

We claim:

1. A structure for a MEMS device comprising:
   a MEMS layer comprising a mass portion and a spring portion;
   a substrate coupled to the MEMS layer, wherein the substrate is vertically disposed relative to the MEMS layer, wherein the substrate comprises a planar region and a stopper region;
   wherein the MEMS layer is configured to be displaced relative to the substrate in an in-plane direction that is parallel to the substrate and configured to be displaced relative to the substrate in an out-of-plane direction that is towards and away from the substrate;
   wherein the MEMS device and the substrate are oriented in a plurality of relative orientations in response to an external force in the out-of-plane direction;
   wherein the spring portion and the stopper region are configured to contact when the external force in the out-of-plane direction exceeds a first threshold force;
   wherein the spring portion is configured to provide a disengaging force in the out-of-plane direction against the stopper region;
   wherein the mass portion and the planar region are configured to contact when the external force in the out-of-plane direction exceeds a second threshold force;
   wherein the second threshold force exceeds the first threshold force.

2. The structure of claim 1 wherein the spring portion is selected from a group consisting of: a torsion spring, a leaf spring.

3. The structure of claim 1
   wherein the substrate comprises an insulating layer and a metal layer overlying the insulating layer; and
   wherein the stopper region comprises a pillar-like structure formed within the metal layer extending down to the insulating layer, and a bumper region overlying the pillar-like structure.

4. The structure of claim 1 wherein the spring portion and the stopper region are configured to impact in response to the external force in the out-of-plane direction exceeding the second threshold before the mass portion and the planar region impact in response to the external force in the out-of-plane direction exceeding the second threshold force.

5. The structure of claim 1 wherein the MEMS device is selected from a group consisting of: an accelerometer and a gyroscope.

6. The structure of claim 1 wherein the second threshold force exceeds 30G.

7. The structure of claim 1:
   wherein the MEMS layer, comprise a lateral spring portion, and an anchor portion, wherein the MEMS layer is coupled to the substrate by the anchor portion; and wherein the MEMS layer is configured to be displaced relative to the substrate in an in-plane direction that is parallel to the substrate;

wherein the MEMS device and the anchor portion are oriented in a plurality of relative orientations in response to an external force in the in-plane direction;

wherein the mass portion and the lateral spring portion are configured to contact when the external force in the in-plane directions exceeds a third threshold force;

wherein the lateral spring portion is configured to provide a disengaging force in the in-plane direction against the mass portion;

wherein the mass portion and the anchor portion are configured to contact when the external force in the in-plane directions exceeds a fourth threshold force; and wherein the fourth threshold force exceeds the third threshold force.

8. The structure of claim 7 wherein the spring portion and the mass portion are configured to impact in response to the external force in the in-plane direction exceeding the fourth threshold before the mass portion and the anchor portion impact in response to the external force in the in-plane direction exceeding the fourth threshold force.

9. The structure of claim 7 wherein the MEMS device is selected from a group consisting of: an accelerometer and a gyroscope.

10. The structure of claim 7 wherein the first threshold force is within a range of 10G to 30G.

11. A method for a MEMS device including a MEMS layer having a mass portion and a spring portion, and a substrate having a planar region and a stopper region, the method comprising:

subjecting the MEMS device to a first external force in an out-of-plane direction towards the planar region, whereby the spring portion and the stopper region impact in response to the first external force in the out-of-plane direction, wherein the mass portion and the planar region do not impact in response to the first external force in the out-of-plane direction, wherein the first external force in the out-of-plane directions exceeds a first threshold force;

subjecting the MEMS device to a second external force in the out-of-plane direction towards the planar region, whereby the spring portion and the stopper region impact and the mass portion and the planar region impact in response to the second external force in the out-of-plane direction, wherein the second external force in the out-of-plane direction exceeds a second threshold force, and wherein the second threshold force exceeds the first threshold force; and subsequently separating the mass portion and the planar region apart in response to a separation force associated with the spring portion and the stopper region impacting.

12. The method of claim 11 wherein the MEMS device includes a torsion portion, and wherein the separating the spring portion and the stopper region apart comprises having the torsion portion separate the spring portion and the stopper region.

13. The method of claim 11 wherein the subjecting the MEMS device to the second external force in the out-of-plane direction comprises: reducing a force of the mass portion and the planar region impacting in response to the separation force associated with the spring portion and the stopper region impacting.

14. The method of claim 11 further comprising determining force data from the MEMS device in response to the first external force.

15. The method of claim 11 wherein the MEMS device is selected from a group consisting of: an accelerometer and a gyroscope.

16. The method of claim 11 wherein the second threshold force exceeds 30G.

17. The method of claim 11 wherein the first threshold is within a range of 10G to 30G.

18. The method of claim 11 wherein the MEMS layer comprises a lateral spring portion and an anchor portion, wherein the anchor portion is coupled to the planar region;

the method further comprising:

subjecting the MEMS device to a third external force in an in-plane direction parallel to the planar region, whereby the mass portion and the lateral spring portion impact in response to the third external force in the in-plane direction, wherein the mass portion and the anchor portion region do not impact in response to the third external force in the in-plane direction, wherein the third external force in the in-plane directions exceeds a third threshold force;

subjecting the MEMS device to a fourth external force in the in-plane direction parallel to the planar region, whereby the mass portion and the lateral spring portion impact in response to the fourth external force in the in-plane direction, wherein the mass portion and the anchor portion region impact in response to the fourth external force in the in-plane direction, wherein the fourth external force in the in-plane directions exceeds a fourth threshold force;

and subsequently separating the mass portion and the anchor portion apart in response to a separation force associated with the mass portion and the lateral spring portion impacting.

19. The method of claim 18 wherein a perturbation to the MEMS device comprises the first external force in the in-plane direction and the third external force in the out-of-plane direction.

20. The method of claim 11 wherein the subjecting the MEMS device to the first external force in the out-of-plane direction towards the planar region, further comprises: dissipating an impact between the spring portion and the stopper region from the stopper region to an underlying substrate layer via one or more pillars, while bypassing an intervening metal layer.

* * * * *